(12) United States Patent
Parkin et al.

(10) Patent No.: US 12,119,036 B2
(45) Date of Patent: Oct. 15, 2024

(54) MAGNETIC MEMORY DEVICES AND METHODS OF CONTROLLING DOMAIN SIZES THEREOF

(71) Applicant: Samsung Electronics Co., Ltd., Suwon-si (KR)

(72) Inventors: Stuart Papworth Parkin, Halle (DE); Jaechun Jeon, Halle (DE); Andrea Migliorini, Halle (DE); Ung Hwan Pi, Hwaseong-si (KR)

(73) Assignees: Samsung Electronics Co., Ltd., Suwon-si (KR); Max-Planck-Gesellschaft zur Förderung der Wissenschaften e.V., Munich (DE)

( * ) Notice: Subject to any disclaimer, the term of this patent is extended or adjusted under 35 U.S.C. 154(b) by 145 days.

(21) Appl. No.: 18/096,089

(22) Filed: Jan. 12, 2023

(65) Prior Publication Data

US 2023/0274772 A1    Aug. 31, 2023

(30) Foreign Application Priority Data

Feb. 28, 2022    (KR) .......................... 10-2022-0026187

(51) Int. Cl.
| | | |
|---|---|---|
| *G11C 11/16* | (2006.01) | |
| *H10B 61/00* | (2023.01) | |
| *H10N 50/80* | (2023.01) | |

(52) U.S. Cl.
CPC ...... *G11C 11/1673* (2013.01); *G11C 11/1675* (2013.01); *H10B 61/00* (2023.02); *H10N 50/80* (2023.02)

(58) Field of Classification Search
CPC ..................................................... G11C 11/16
See application file for complete search history.

(56) References Cited

U.S. PATENT DOCUMENTS

| | | |
|---|---|---|
| 6,834,005 B1 | 12/2004 | Parkin |
| 7,551,469 B1 | 6/2009 | Parkin |
| 7,782,663 B2 | 8/2010 | Kim |
| 8,040,724 B2 | 10/2011 | Suzuki et al. |
| 8,406,029 B2 | 3/2013 | Kim et al. |
| 8,792,271 B2 | 7/2014 | Morise et al. |
| 9,117,523 B1 | 8/2015 | Morris et al. |
| 10,276,224 B2 | 4/2019 | Morise et al. |

(Continued)

OTHER PUBLICATIONS

Parkin, et al., "Magnetic Domain-Wall Racetrack Memory", Science 320:190-194, 2008.

(Continued)

*Primary Examiner* — Jason Lappas
(74) *Attorney, Agent, or Firm* — Myers Bigel, P.A.

(57) ABSTRACT

A magnetic memory device may include a magnetic track, which is extended in a first direction, and a first electrode, which is provided at a biasing point of the magnetic track and is configured to apply a voltage to the magnetic track. The magnetic track includes a first region between a first end of the magnetic track and the biasing point and a second region between the biasing point and a second end of the magnetic track. The first electrode may be configured to cause a difference between a current density in the first region and a current density in the second region.

20 Claims, 9 Drawing Sheets

(56) References Cited

U.S. PATENT DOCUMENTS

2014/0353781 A1* 12/2014 Baldi .................. G11C 11/161
                                                                               257/421
2017/0136603 A1    5/2017  Ganapathiappan et al.
2018/0166197 A1    6/2018  Wang et al.

OTHER PUBLICATIONS

Schellekens, et al., "Electric-field control of domain wall motion in perpendicularly magnetized materials", Nature Communications 3:847, 2012.

* cited by examiner

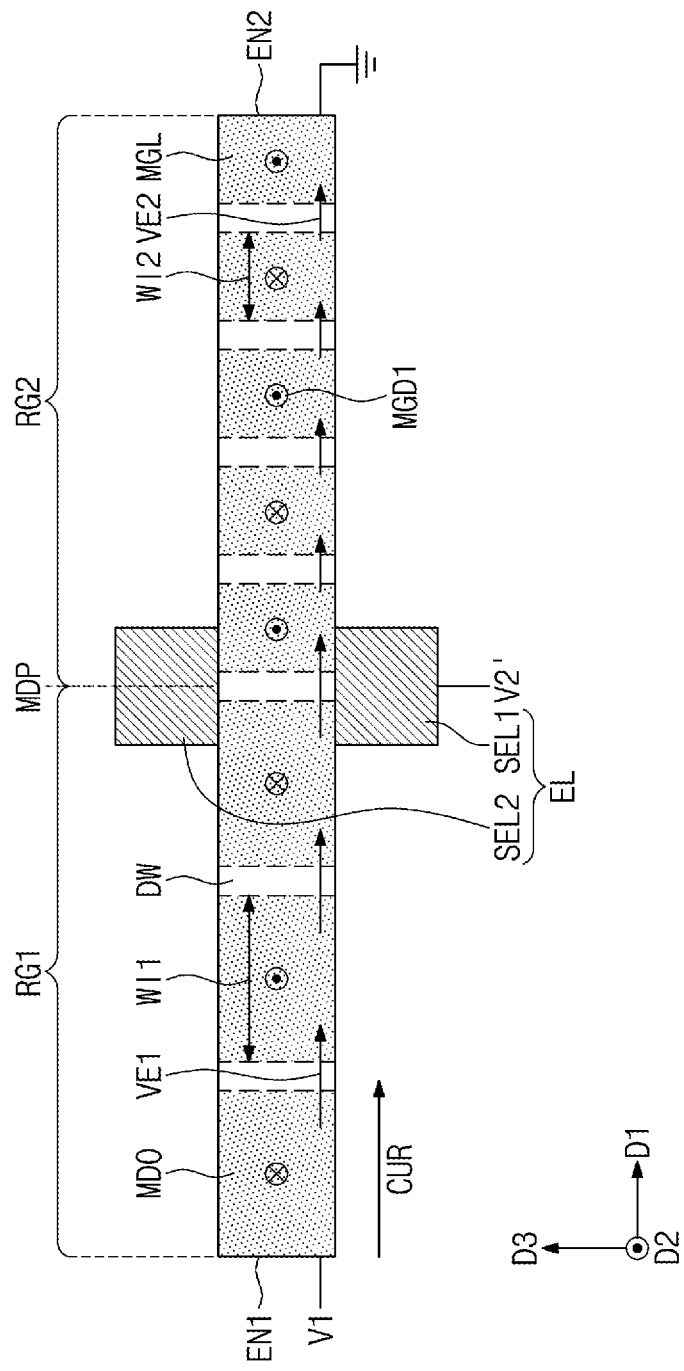

MAGNETIC MEMORY DEVICES AND METHODS OF CONTROLLING DOMAIN SIZES THEREOF

CROSS-REFERENCE TO RELATED APPLICATION

This U.S. non-provisional patent application claims priority under 35 U.S.C. § 119 to Korean Patent Application No. 10-2022-0026187, filed on Feb. 28, 2022, in the Korean Intellectual Property Office, and the entire contents of the above-identified application are hereby incorporated by reference.

TECHNICAL FIELD

The present disclosure relates to magnetic memory devices, and in particular, relates to magnetic memory devices having domain sizes that can be actively controlled.

Due to increasing demand for electronic devices with fast speeds and/or low power consumption, there is a corresponding increasing demand for memory devices used as components within electronic devices that have fast operating speeds and/or low operating voltages. Magnetic memory devices are being considered and developed to meet such demands. Magnetic memory devices have technical advantages, such as reduced latency and/or non-volatility, and are emerging as next-generation memory devices. Recently, new magnetic memory devices that exploit movement of magnetic domain walls are being researched and developed.

SUMMARY

Some aspects of the inventive concepts provide magnetic memory devices having domain sizes that can be actively controlled.

Some aspects of the inventive concepts provide methods of actively controlling a domain size of a magnetic memory device.

According to some embodiments of the inventive concepts, a magnetic memory device may include a magnetic track having first and second ends, which is extended in a first direction, and a first electrode, which is provided at a biasing point of the magnetic track between the first and second ends, the first electrode configured to apply a voltage to the magnetic track. The magnetic track may include a first region between the first end of the magnetic track and the biasing point and a second region between the biasing point and the second end of the magnetic track. The first electrode may be configured to cause a difference between a first current density in the first region and a second current density in the second region.

According to some embodiments of the inventive concepts, a magnetic memory device may include a magnetic track including a conductive line including a heavy metal and a magnetic line on the conductive line, a first electrode and a second electrode provided on the magnetic track and adjacent to each other, and a read/write element provided on the magnetic line between the first and second electrodes. The first electrode may be configured to apply a first voltage to the conductive line, and the second electrode may be configured to apply a second voltage to the conductive line.

According to some embodiments of the inventive concepts, a method of controlling a domain size of a magnetic memory device may be provided. Here, the magnetic memory device may include a magnetic track, which is extended in a first direction and includes a first region between a first end of the magnetic track and the biasing point and a second region between the biasing point and a second end of the magnetic track, and a first electrode, which is provided at a biasing point of the magnetic track. The method may include applying first and second voltages to the first and second ends, respectively, to move a magnetic domain wall, which defines a magnetic domain, in the first direction, and applying a third voltage to the first electrode to move the magnetic domain wall in the first region with a first velocity of the magnetic domain wall and in the second region with a second velocity, the first velocity different from the second velocity.

BRIEF DESCRIPTION OF THE DRAWINGS

FIGS. 2A, 2B, and 2C are plan views of the magnetic memory device of FIG. 1, which are presented to illustrate aspects of a method of controlling a domain size of a magnetic memory device according to some embodiments of the inventive concepts.

DETAILED DESCRIPTION

Some aspects of the inventive concepts will now be described more fully with reference to the accompanying drawings, in which some example embodiments of the inventive concepts are shown.

Figure 1:
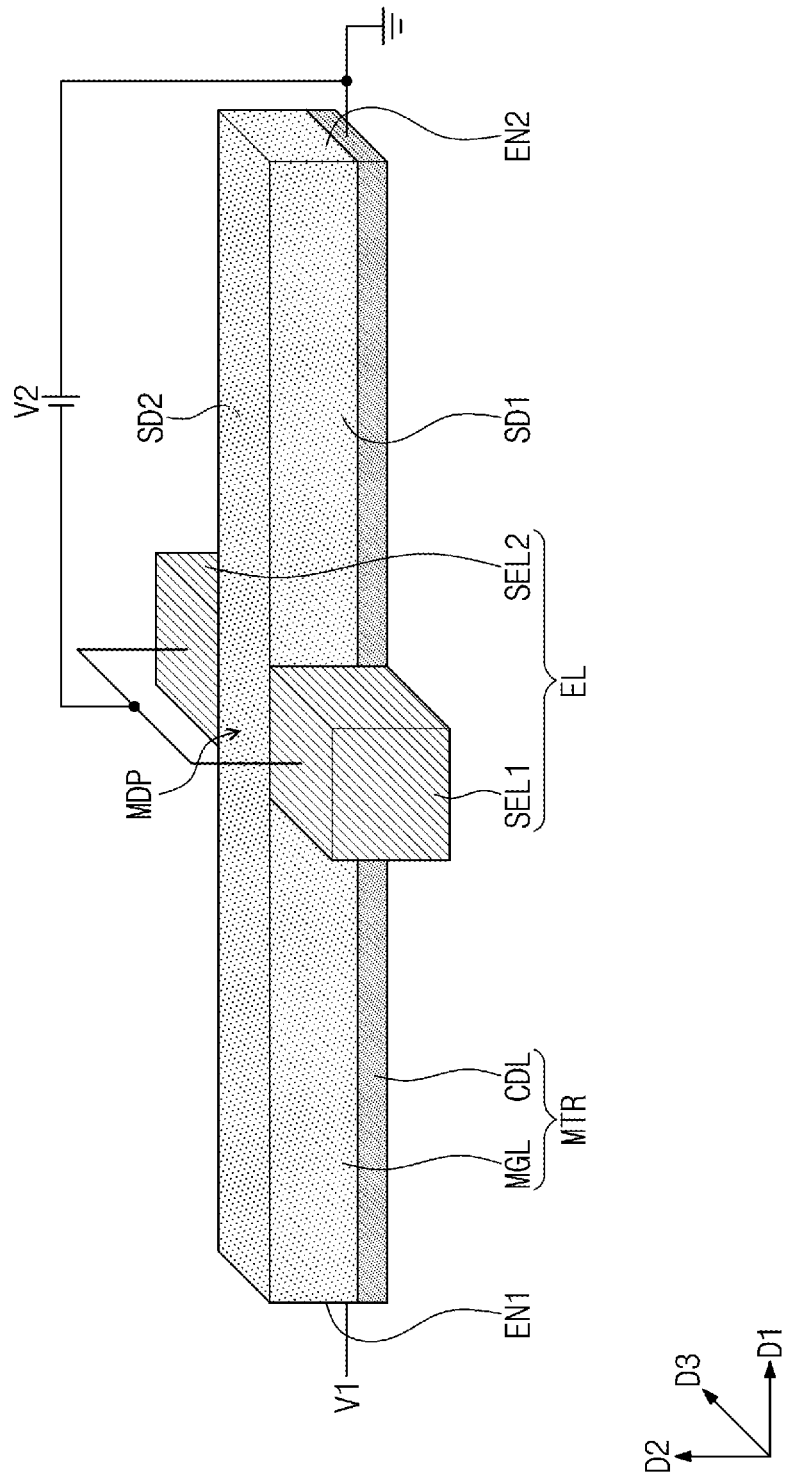
FIG. 1 is a perspective view schematically illustrating a magnetic memory device according to some embodiments of the inventive concepts.

FIG. 1 is a perspective view schematically illustrating a magnetic memory device according to some embodiments of the inventive concepts.

Figure 7:
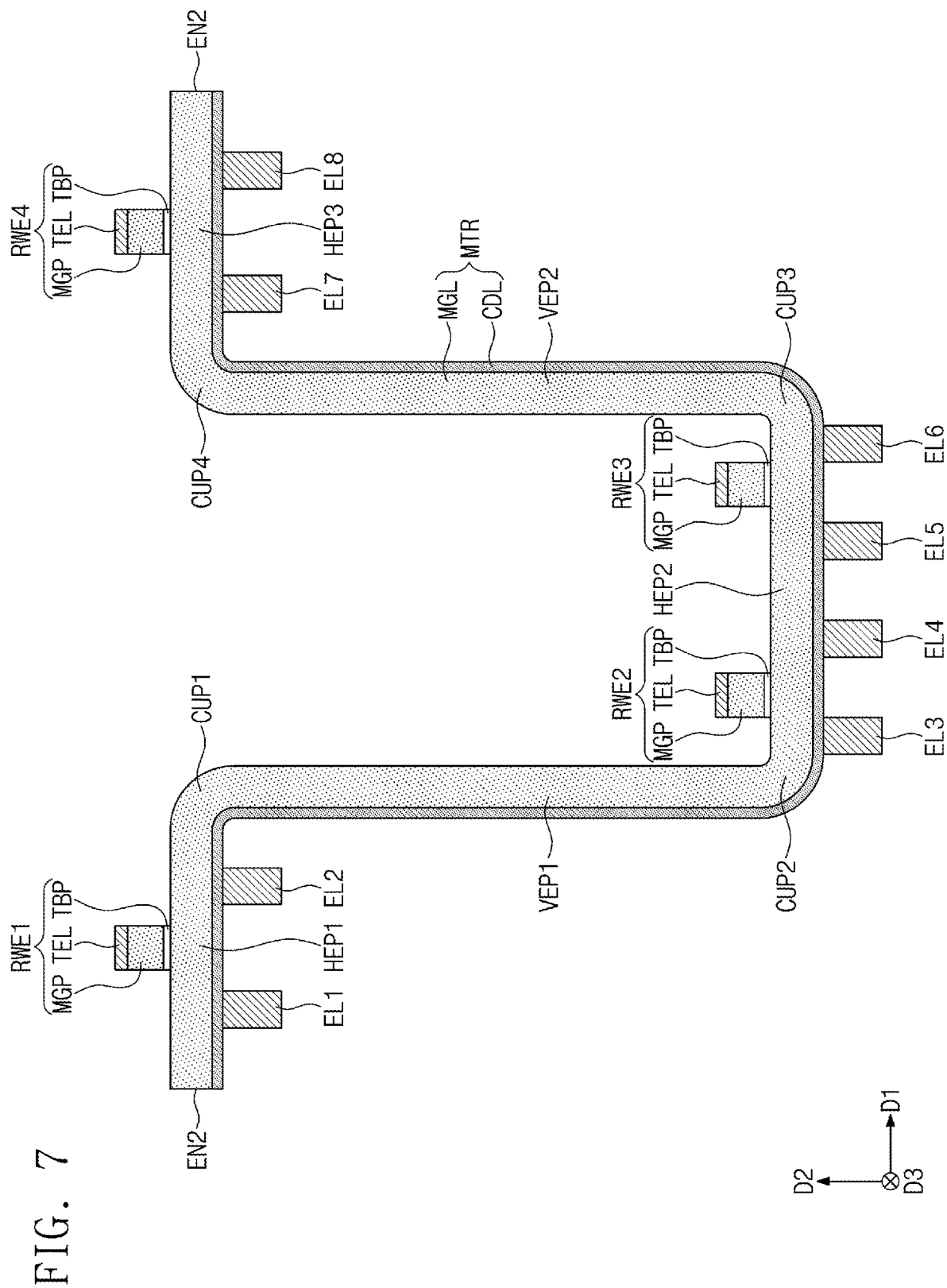

Referring to FIG. 1, a magnetic track MTR that extends in a first direction D1 may be provided. The magnetic track MTR may have a line shape. The magnetic track MTR may include a conductive line CDL and a magnetic line MGL on the conductive line CDL. The conductive and magnetic lines CDL and MGL may each be a line-shaped pattern and have a line shape that extends in the first direction D1. Although the conductive and magnetic lines CDL and MGL shown in FIG. 1 have a line shape extending in the first direction D1, the inventive concepts are not limited thereto. For example, in some embodiments, the conductive and magnetic lines CDL and MGL (and the magnetic track MTR) may have a bent shape (e.g., including a U-shaped portion, as shown in FIG. 7).

The magnetic line MGL may be stacked on the conductive line CDL in a second direction D2 perpendicular to the first direction D1. The magnetic track MTR (and in some embodiments the conductive line CDL and/or magnetic line MGL) may have a linewidth in a third direction D3. The third direction D3 may be perpendicular to both of the first and second directions D1 and D2. The magnetic line MGL may include a magnetic element. For example, the magnetic line MGL may include at least one of cobalt (Co), iron (Fe), and nickel (Ni).

The conductive line CDL may be configured to produce a spin orbit torque when there is a current flowing through the conductive line CDL. The conductive line CDL may be formed of or include a material, which causes a spin Hall effect or a Rashba effect when the current flows in the first direction D1 or an opposite direction of the first direction D1. The conductive line CDL may include a heavy metal whose atomic number is greater than 30. For example, the conductive line CDL may include iridium (Ir), ruthenium (Ru), tantalum (Ta), platinum (Pt), palladium (Pd), bismuth (Bi), titanium (Ti), or tungsten (W).

The magnetic track MTR may include a first end EN1 and a second end EN2. The first end EN1 and the second end EN2 may be opposite to each other in the first direction D1. In an embodiment, a first voltage V1 may be applied to the first end EN1, and a third voltage (e.g., a ground voltage) may be applied to the second end EN2. For example, the first voltage V1 may be applied to the first end EN1 of the conductive line CDL, and the ground voltage may be applied to the second end EN2 of the conductive line CDL. Due to a potential difference between the first end EN1 and the second end EN2, a current flow may be produced in the conductive line CDL.

The magnetic track MTR may include a first side surface SD1 and a second side surface SD2. The first and second side surfaces SD1 and SD2 may be opposite to each other in the third direction D3, and thus may be separated from each other a distance equal to the linewidth in the third direction D3. An electrode EL may be provided on at least one of the first and second side surfaces SD1 and SD2. The electrode EL may be connected to the at least one of the first and second side surfaces SD1 and SD2. The electrode EL may be provided or arranged at a biasing point MDP of the magnetic track MTR. The electrode EL may be configured to apply a second voltage V2 to the conductive line CDL of the biasing point MDP.

In some embodiments, the electrode EL may include a first sub-electrode SEL1 on the first side surface SD1 and a second sub-electrode SEL2 on the second side surface SD2. The first and second sub-electrodes SEL1 and SEL2 may be used to apply bias voltages to opposite ends of the conductive line CDL near the biasing point MDP. For example, the electrode EL may be formed of or include at least one metallic material (e.g., copper, tungsten, and aluminum) and/or metal nitride material (e.g., tantalum nitride, titanium nitride, and tungsten nitride).

Figure 2A:
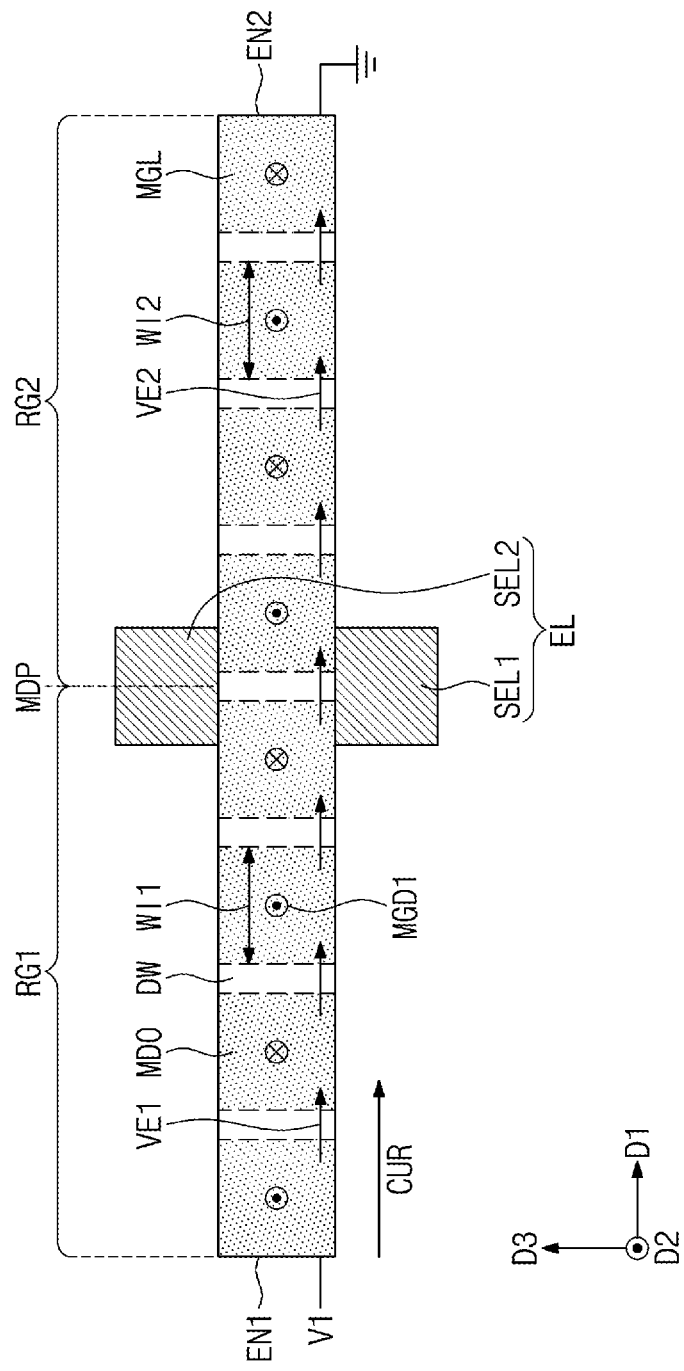
Figure 2B:
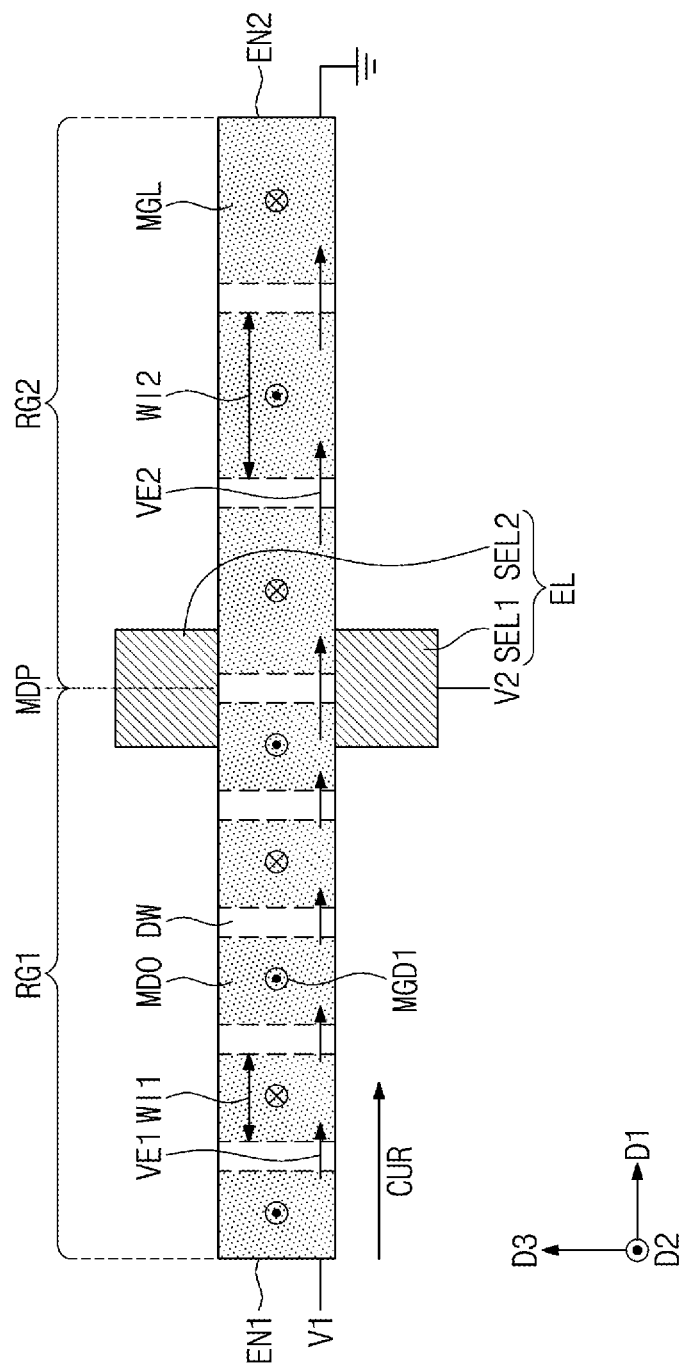

FIGS. 2A, 2B, and 2C are plan views of the magnetic memory device of FIG. 1, which are presented to illustrate aspects of a method of controlling a domain size of a magnetic memory device according to some embodiments of the inventive concepts.

Referring to FIG. 2A, the magnetic line MGL may include a plurality of magnetic domains MDO and a plurality of magnetic domain walls DW, which are arranged in the first direction D1. The magnetic domains MDO and the magnetic domain walls DW may be alternately arranged in the first direction D1.

Each of the magnetic domains MDO may be a region, which is a part of the magnetic line MGL and has a magnetic moment aligned to a specific direction. Each of the magnetic domain walls DW may be a region between a pair of the magnetic domains MDO, which are adjacent to each other and have different magnetic moment directions. The magnetic domain wall DW may define a boundary between two adjacent ones of the magnetic domains MDO.

A size and a magnetization direction of each of the magnetic domains MDO may be controlled by a shape and size of a magnetic structure and an external energy. The magnetic domain walls DW may be moved by a magnetic field or a current applied to the magnetic line MGL.

Each of the magnetic domains MDO may have a perpendicular magnetic anisotropy (PMA). Each of the magnetic domains MDO may have a first magnetization direction MGD1 that is perpendicular to an interface between the magnetic line MGL and the conductive line CDL. The first magnetization direction MGD1 may be parallel or antiparallel to the second direction D2.

The first magnetization directions MGD1 of adjacent ones of the magnetic domains MDO may be opposite to each other. The magnetic domain wall DW may define a boundary between the adjacent ones of the magnetic domains MDO having opposite magnetization directions.

As described with reference to FIG. 1, the first voltage V1 may be applied to the first end EN1 of the conductive line CDL, and the ground voltage may be applied to the second end EN2. In this case, a current CUR, which flows in the first direction D1 or an opposite direction of the first direction D1, may be produced in the conductive line CDL.

In the case where the current CUR flows through the conductive line CDL, the magnetic domain walls DW in the magnetic line MGL may be moved in the first direction D1. The magnetic domains MDO may also be moved in the first direction D1, along with the magnetic domain walls DW.

The movement of the magnetic domain walls DW may be caused by a spin orbit torque and a Dzyaloshinskii-Moriya interaction (DMI), which occurs at an interface between the conductive line CDL and the magnetic line MGL. A moving direction of the magnetic domain walls DW may depend on a chirality of the magnetic domain walls DW.

The electrode EL may be placed near the biasing point MDP. The magnetic line MGL may include a first region RG1 between the first end EN1 and the biasing point MDP, and the magnetic line MGL may include a second region RG2 between the biasing point MDP and the second end EN2.

In some embodiments and/or in the configuration illustrated in FIG. 2A, a voltage (or bias) may not be applied to the electrode EL. This may correspond to a structure in which the electrode EL is omitted. In this case, a current density in the first region RG1 of the magnetic line MGL may be substantially equal to that in the second region RG2 of the magnetic line MGL.

The magnetic domain wall DW in the first region RG1 may be moved with a first velocity VE1. The magnetic domain wall DW in the second region RG2 may be moved with a second velocity VE2. The first velocity VE1 may be substantially equal to the second velocity VE2.

The velocity of the magnetic domain wall DW may be affected by a current density in a region through which the magnetic domain wall DW is moved. The higher the current density, the faster the velocity of the magnetic domain wall DW. The lower the current density, the slower the velocity of the magnetic domain wall DW. As described above, since the current density in the first region RG1 is substantially equal to the current density in the second region RG2, the first velocity VE1 may be substantially equal to the second velocity VE2.

The magnetic domain MDO in the first region RG1 may have a first width WI1 in the first direction D1, and the magnetic domain MDO in the second region RG2 may have a second width WI2 in the first direction D1. The first width WI1 may be substantially equal to the second width WI2. Since the velocity of the magnetic domain walls DW is the same in the first and second regions RG1 and RG2, a size of the magnetic domain MDO in the first region RG1 may be substantially equal to a size of the magnetic domain MDO in the second region RG2. The size of the magnetic domains MDO for each of the first region RG1 and the second region R2 may correspond to a bit size of the respective regions. Accordingly, in some embodiments and/or in configurations similar to that illustrated in FIG. 2A, a bit size of the first region RG1 may be equal to a bit size of the second region RG2.

Referring to FIG. 2B, the second voltage V2 may be applied to the biasing point MDP through the electrode EL. In this case, a potential difference (i.e., V1–V2) between the first end EN1 and the biasing point MDP may be changed to a value that is different from a potential difference (i.e., V2) between the biasing point MDP and the second end EN2.

In some embodiments and/or in configurations similar to that illustrated in FIG. 2B, the potential difference (i.e., V1–V2) between the first end EN1 and the biasing point MDP may be smaller than the potential difference (i.e., V2) between the biasing point MDP and the second end EN2. Accordingly, the current density in the first region RG1 may be less than the current density in the second region RG2.

The magnetic domain wall DW in the first region RG1 may be moved with a first velocity VE1. The magnetic domain wall DW in the second region RG2 may be moved with a second velocity VE2. As discussed above, the velocity of the magnetic domain wall DW may be affected by a current density in a region through which the magnetic domain wall DW is moved. Since the current density in the first region RG1 is less than the current density in the second region RG2, the first velocity VE1 may be less than the second velocity VE2.

For example, the magnetic domain wall DW may be moved in the first direction D1 from the first end EN1 toward the second end EN2. In the first region RG1, the magnetic domain wall DW may be moved with the first velocity VE1. If the magnetic domain wall DW reaches the biasing point MDP, the magnetic domain wall DW may be moved with an increased velocity (e.g., the second velocity VE2).

The magnetic domain MDO in the first region RG1 may have a first width WI1 in the first direction D1, and the magnetic domain MDO in the second region RG2 may have a second width WI2 in the first direction D1. The first width WI1 may be smaller than the second width WI2. In some embodiments, a ratio of the second width WI2 to the first width WI1 (i.e., WI2/WI1) may be greater than 1 and may be smaller than 2.

Since the velocity of the magnetic domain walls DW is less in the first region RG1 than in the second region RG2, a size of the magnetic domain MDO in the first region RG1 may be smaller than a size of the magnetic domain MDO in the second region RG2. Accordingly, in some embodiments and/or in configurations similar to that illustrated in FIG. 2B, a bit size of the second region RG2 may be greater than a bit size of the first region RG1.

Referring to FIG. 2C, a second voltage V2' may be applied to the biasing point MDP through the electrode EL. In some embodiments and/or in configurations similar to that illustrated in FIG. 2C, a potential difference (i.e., V1–V2') between the first end EN1 and the biasing point MDP may be greater than a potential difference V2' between the biasing point MDP and the second end EN2. In this case, the current density in the first region RG1 may be greater than the current density in the second region RG2.

The magnetic domain wall DW in the first region RG1 may be moved with the first velocity VE1. The magnetic domain wall DW in the second region RG2 may be moved with the second velocity VE2. Since the current density in the first region RG1 is greater than the current density in the second region RG2, the first velocity VE1 may be greater than the second velocity VE2.

For example, the magnetic domain wall DW may be moved in the first direction D1 from the first end EN1 toward the second end EN2. In the first region RG1, the magnetic domain wall DW may be moved with the first velocity VE1. If the magnetic domain wall DW reaches the biasing point MDP, the magnetic domain wall DW may be moved with a decreased velocity (e.g., the second velocity VE2).

The magnetic domain MDO in the first region RG1 may have the first width WI1 in the first direction D1, and the magnetic domain MDO in the second region RG2 may have the second width WI2 in the first direction D1. The first width WI1 may be greater than the second width WI2. In some embodiments, a ratio of the first width WI1 to the second width WI2 (i.e., WI1/WI2) may be greater than 1 and smaller than 2.

Since the velocity of the magnetic domain walls DW is faster in the first region RG1 than in the second region RG2, a size of the magnetic domain MDO in the first region RG1 may be greater than a size of the magnetic domain MDO in the second region RG2. That is, in some embodiments and/or in configurations similar to that illustrated in FIG. 2C, a bit size of the second region RG2 may be smaller than a bit size of the first region RG1.

According to some embodiments of the inventive concepts, a voltage, which is applied to the biasing point MDP through the electrode EL, may be used to adjust or change the velocity of the magnetic domain wall DW. Thus, it may be possible to actively decrease or increase the size of the magnetic domains MDO.

While the magnetic domains MDO and/or magnetic domain walls DW are moved along the magnetic line MGL, a size of the magnetic domain MDO may be changed by a read/write element or peripheral elements. In the case where the size of the magnetic domain MDO is unintentionally changed, the magnetic memory device may malfunction. According to some embodiments of the inventive concept, at least one electrode EL, which is configured to apply a bias to the magnetic line MGL, may be used to actively decrease or increase the changed sizes of the magnetic domains MDO. Accordingly, it may be possible to prevent the malfunction of the magnetic memory device.

Figure 3:
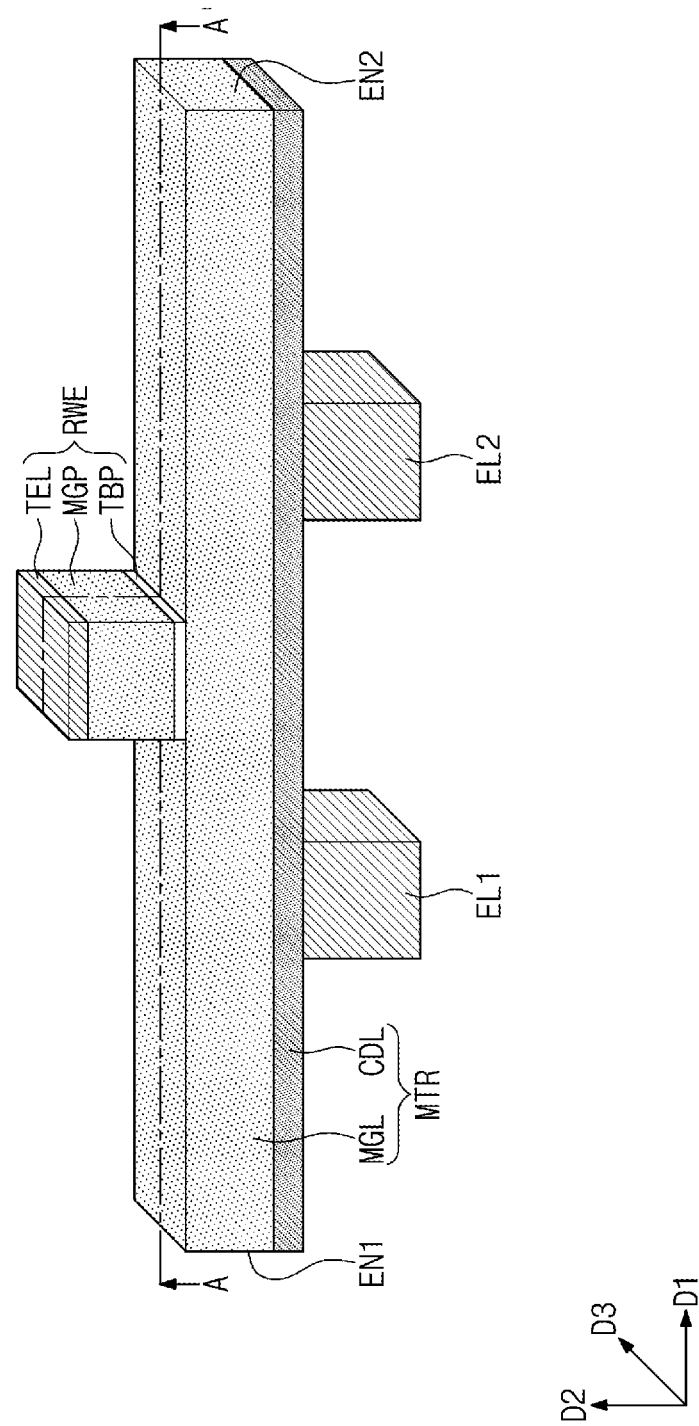
FIG. 3 is a perspective view schematically illustrating a magnetic memory device according to some embodiments of the inventive concepts.
Figure 4:
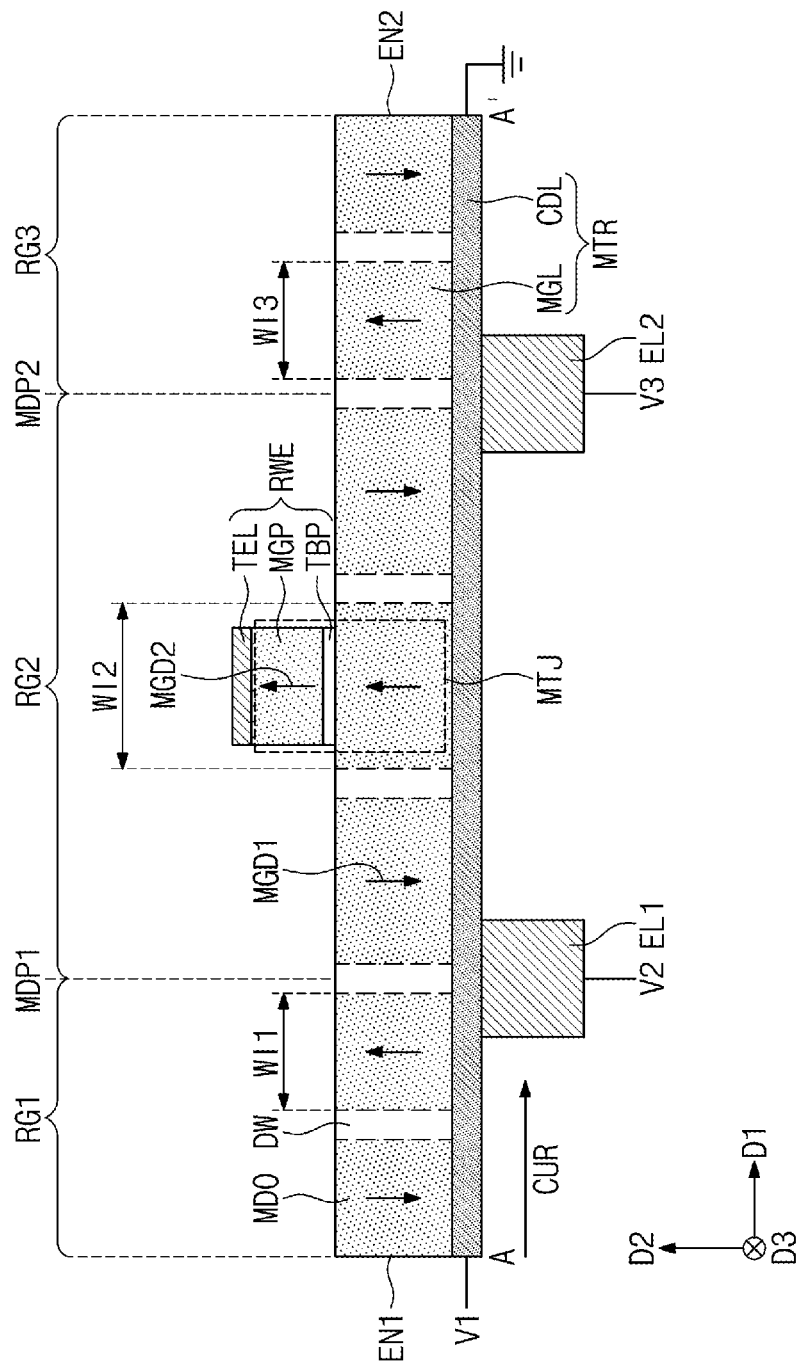
FIG. 4 is a sectional view taken along a line A-A' of FIG. 3.

FIG. 3 is a perspective view schematically illustrating a magnetic memory device according to some embodiments of the inventive concepts. FIG. 4 is a sectional view taken along a line A-A' of FIG. 3.

Referring to FIGS. 3 and 4, a first electrode EL1 may be provided at a first biasing point MDP1 of the magnetic track MTR. A second electrode EL2 may be provided at a second biasing point MDP2 of the magnetic track MTR. In some embodiments, the first electrode EL1 and the second electrode EL2 may be provided on a bottom surface of the conductive line CDL.

The magnetic line MGL may include a first region RG1 from the first end EN1 to the first biasing point MDP1, a second region RG2 from the first biasing point MDP1 to the second biasing point MDP2, and a third region RG3 from the second biasing point MDP2 to the second end EN2.

A read/write element RWE may be provided on the second region RG2 of the magnetic line MGL. In some embodiments, the read/write element RWE may be disposed on a top surface of the magnetic line MGL. In some embodiments, the read/write element RWE may include a GMR sensor, which may be operated using a giant magneto resistance effect. In some embodiments, the read/write element RWE may include a TMR sensor, which is operated using a tunnel magneto resistance effect. In some embodiments, the read/write element RWE may include a magnetic pattern MGP on the magnetic line MGL, a tunnel barrier pattern TBP between the magnetic line MGL and the magnetic pattern MGP, and an electrode pattern TEL on the magnetic pattern MGP.

The magnetic pattern MGP may be between the tunnel barrier pattern TBP and the electrode pattern TEL. The magnetic pattern MGP may include at least one of cobalt (Co), iron (Fe), or nickel (Ni). The tunnel barrier pattern TBP may include at least one of magnesium oxide, titanium oxide, aluminum oxide, magnesium-zinc oxide, or magnesium-boron oxide. The electrode pattern TEL may be formed of or include a conductive material, and in some embodiments, the electrode pattern TEL may be formed of or include at least one metallic material (e.g., copper, tungsten, or aluminum) and/or metal nitride material (e.g., tantalum nitride, titanium nitride, or tungsten nitride).

The read/write element RWE may correspond to one of the magnetic domains MDO in the second region RG2. The read/write element RWE and the magnetic domain MDO corresponding thereto may be overlapped with each other vertically (e.g., in the second direction D2).

The magnetic pattern MGP of the read/write element RWE may have a perpendicular magnetic anisotropy. The magnetic pattern MGP may have a second magnetization direction MGD2 that is perpendicular to an interface between the magnetic pattern MGP and the tunnel barrier pattern TBP. The second magnetization direction MGD2 of the magnetic pattern MGP may be fixed to a specific direction. The first magnetization directions MGD1 of the magnetic domains MDO in the magnetic line MGL may be parallel or antiparallel to the second magnetization direction MGD2 of the magnetic pattern MGP.

The magnetic pattern MGP and the magnetic domain MDO, which is vertically overlapped therewith, may constitute a magnetic tunnel junction MTJ. The magnetic pattern MGP may have the fixed second magnetization direction MGD2 and may be used as a fixed layer. The first magnetization direction MGD1 of the magnetic domain MDO below the magnetic pattern MGP may be changed depending on the movement of the magnetic domain wall DW. In other words, the magnetic domain MDO below the magnetic pattern MGP may constitute a free layer.

In another embodiment, the first magnetization direction MGD1 and the second magnetization direction MGD2 may be parallel to an interface between the tunnel barrier pattern TBP and the magnetic pattern MGP. For example, the first and second magnetization directions MGD1 and MGD2 may be parallel or antiparallel to the first direction D1.

In a reading operation, a read current (Iread) may flow through the magnetic tunnel junction MTJ. The read current (Iread) may be used to determine a resistance state of the magnetic tunnel junction MTJ. By measuring the read current (Iread), it may be possible to determine whether the magnetic tunnel junction MTJ is a high-resistance state or in a low-resistance state. A data (e.g., 0 or 1), which is stored in the free layer (i.e., the magnetic domain MDO), may be determined from the resistance state of the magnetic tunnel junction MTJ.

In the case where the first magnetization direction MGD1 of the magnetic domain MDO below the magnetic pattern MGP is parallel to the second magnetization direction MGD2, the magnetic tunnel junction MTJ may be in a low-resistance state. By contrast, in the case where the first magnetization direction MGD1 of the magnetic domain MDO below the magnetic pattern MGP is antiparallel to the second magnetization direction MGD2, the magnetic tunnel junction MTJ may be in a high-resistance state. A data (0 or 1), which is stored in the magnetic domain MDO, may be determined based on the resistance state of the magnetic tunnel junction MTJ.

In a writing operation, a write current (Isw) may flow through the magnetic tunnel junction MTJ. The write current (Isw) may have a magnitude that is greater than that of the read current (Iread). A switching of the first magnetization direction MGD1 of the magnetic domain MDO below the magnetic pattern MGP may be switched by a spin transfer torque produced from the write current (Isw). The first magnetization direction MGD1 may be switched to be parallel or antiparallel to the second magnetization direction MGD2.

Each of the magnetic line MGL and the magnetic pattern MGP may be formed of or include at least one of cobalt (Co), iron (Fe), or nickel (Ni), and in some embodiments, it may further contain at least one non-magnetic material, such as boron (B), zinc (Zn), aluminum (Al), titanium (Ti), ruthenium (Ru), tantalum (Ta), silicon (Si), silver (Ag), gold (Au), copper (Cu), carbon (C), and/or nitrogen (N). In some embodiments, each of the magnetic line MGL and the magnetic pattern MGP may include at least one of i) perpendicular magnetic materials (e.g., CoFeTb, CoFeGd, and CoFeDy), ii) perpendicular magnetic materials with $L1_0$ structure, iii) CoPt-based materials with hexagonal-close-packed structure, and/or iv) perpendicular magnetic structures. The perpendicular magnetic material with the $L1_0$ structure may include at least one of $L1_0$ FePt, $L1_0$ FePd, $L1_0$ CoPd, or $L1_0$ CoPt. The perpendicular magnetic structures may include magnetic and non-magnetic layers that are alternatingly and repeatedly stacked. As an example, the perpendicular magnetic structure may include at least one of $(Co/Pt)n$, $(CoFe/Pt)n$, $(CoFe/Pd)n$, $(Co/Pd)n$, $(Co/Ni)n$, $(CoNi/Pt)n$, $(CoCr/Pt)n$, or $(CoCr/Pd)n$, where "n" is a natural number equal to or greater than 2. Each of the magnetic line MGL and the magnetic pattern MGP may be formed of or include at least one of CoFeB or Co-based Heusler alloys.

According to some embodiments, the first electrode EL1 may be applied with the second voltage V2, and the second electrode EL2 may be applied with a third voltage V3. In this case, a current density in the second region RG2 may be increased to a value that is greater than a current density in each of the first and third regions RG1 and RG3.

Since the current density in the second region RG2 is relatively increased, the width WI2 of the magnetic domains MDO in the second region RG2 may be increased. The width WI2 of the magnetic domains MDO in the second region RG2 may be greater than the width WI1 of the magnetic domains MDO in the first region RG1 and may be greater than a width WI3 of the magnetic domains MDO in the third region RG3. In other words, and with reference to the discussion above regarding bit sizes, the bit size of the second region RG2 may be selectively increased or greater than the bit size of the first region RG1 and/or the third region RG3.

For example, the magnetic domain MDO may be moved from the first end EN1 toward the second end EN2 in the first direction D1. Owing to the first electrode EL1, a width of the magnetic domain MDO may be increased from the first width WI1 to the second width WI2. If the magnetic domain MDO passes through a region from the read/write element RWE to the second electrode EL2, the width of the magnetic domain MDO may be reduced from the second width WI2 to a third width WI3 by the second electrode EL2.

Since the magnetic domain MDO has an increased width in the second region RG2, the read/write operation on the magnetic domain MDO may be effectively executed by the read/write element RWE. That is, in the magnetic memory device according to some embodiments of the inventive concept, the reliability in the read/write operation may be improved by actively controlling the size of the magnetic domain MDO.

Figure 5:
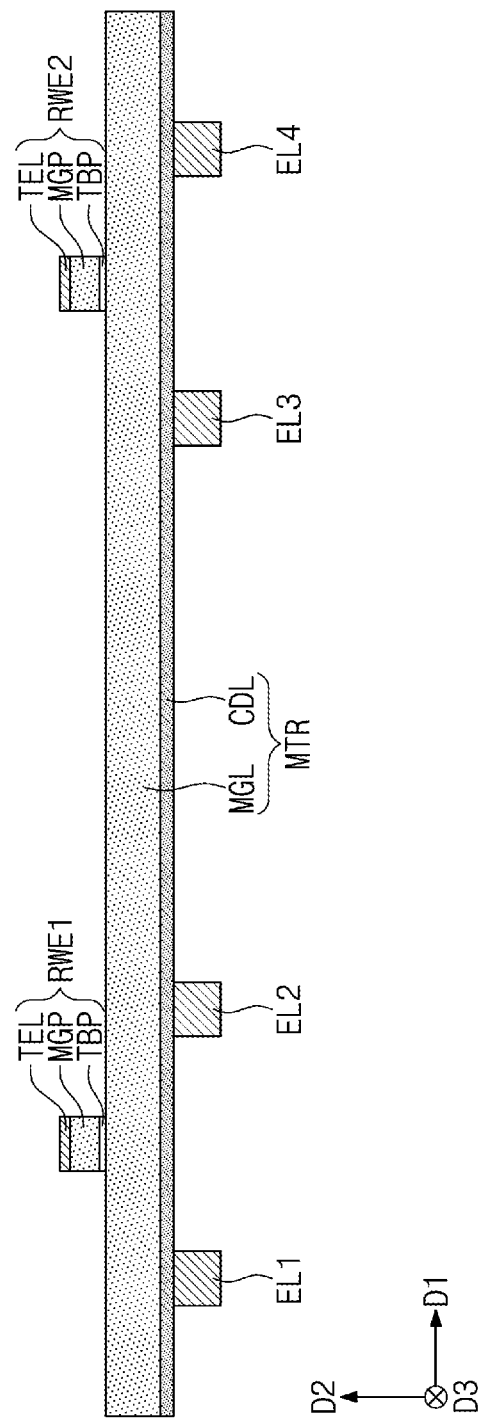
FIGS. 5, 6, and 7 are sectional views schematically illustrating a magnetic memory device according to some embodiments of the inventive concepts.
Figure 6:
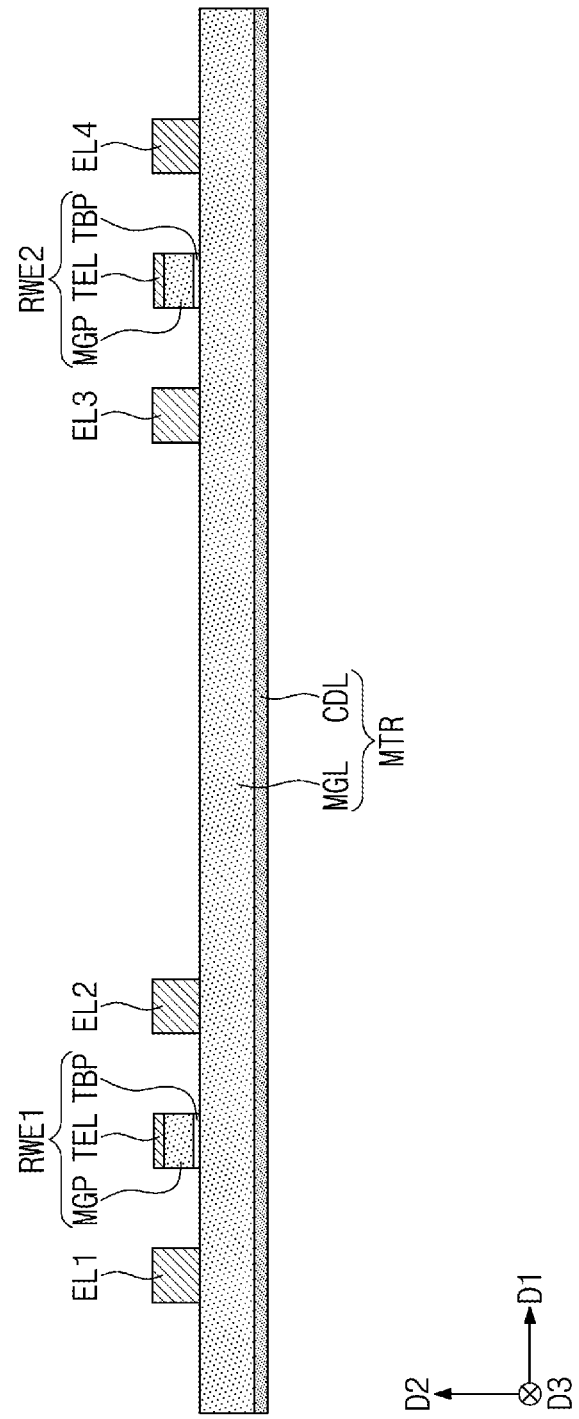

FIGS. 5, 6, and 7 are sectional views schematically illustrating a magnetic memory device according to some embodiments of the inventive concepts. For concise description, elements previously described with reference to FIGS. 1 to 4 may be identified by similar or identical reference numbers without repeating an overlapping description thereof.

Referring to FIG. 5, first to fourth electrodes EL1-EL4 may be provided on the bottom surface of the conductive line CDL. A first read/write element RWE1 may be provided on the magnetic line MGL between the first and second electrodes EL1 and EL2. A second read/write element RWE2 may be provided on the magnetic line MGL between the third and fourth electrodes EL3 and EL4.

As previously described with reference to FIG. 4, the first and second electrodes EL1 and EL2 may be used to actively change a size of the magnetic domain MDO below the first read/write element RWE1. The third and fourth electrodes EL3 and EL4 may be used to actively change a size of the magnetic domain MDO below the second read/write element RWE2.

In the case where there is a current flowing through the conductive line CDL, the magnetic domain MDO in the magnetic line MGL may be moved in the first direction D1. The magnetic domain MDO, which passed through the first electrode EL1, may have an increased size. The first read/write element RWE1 may perform a writing operation on the magnetic domain MDO with the increased size, and in this case, the magnetic domain MDO may be programmed to have a specific magnetization direction. The magnetic domain MDO may have a reduced size, while passing through the second electrode EL2. The magnetic domain MDO may be moved toward the third electrode EL3 in the first direction D1 and may have an increased size, when it passes through the third electrode EL3. A reading operation using the second read/write element RWE2 may be performed on the magnetic domain MDO with the increased size to read out a data (e.g., 0 or 1) stored in the magnetic domain MDO. The size of the magnetic domain MDO may be reduced, while the magnetic domain MDO passes through the fourth electrode EL4.

Referring to FIG. 6, the first to fourth electrodes EL1-EL4 may be provided on the magnetic line MGL. The magnetic line MGL may be in direct contact with the conductive line CDL and may be formed of or include at least one conductive material. Thus, a voltage (or bias) may be applied to the conductive line CDL, even when the first to fourth electrodes EL1-EL4 are provided on the magnetic line MGL. The remaining elements of FIG. 6 may be configured to have substantially the same features as those described with reference to FIG. 5.

Referring to FIG. 7, the magnetic track MTR may be provided to have a three-dimensional structure. The magnetic track MTR may have a shape of a letter 'U', when viewed in a sectional view. In greater detail, the magnetic track MTR may include a first horizontal extended portion HEP1, a first vertical extended portion VEP1, a second horizontal extended portion HEP2, a second vertical extended portion VEP2, and a third horizontal extended portion HEP3.

The magnetic track MTR may include a first curved portion CUP1 between the first horizontal extended portion HEP1 and the first vertical extended portion VEP1, a second curved portion CUP2 between the first vertical extended portion VEP1 and the second horizontal extended portion HEP2, a third curved portion CUP3 between the second horizontal extended portion HEP2 and the second vertical extended portion VEP2, and a fourth curved portion CUP4 between the second vertical extended portion VEP2 and the third horizontal extended portion HEP3.

Each of the first and second horizontal extended portions HEP1 and HEP2 may have a line shape extending in the first direction D1. Each of the first and second vertical extended portions VEP1 and VEP2 may have a line shape extending in the second direction D2. Each of the first to fourth curved portions CUP1-CUP4 may have a curved shape.

The first electrode EL1 and the second electrode EL2 may be provided on the first horizontal extended portion HEP1, and the first read/write element RWE1 may be provided between the first and second electrodes EL1 and EL2. The third electrode EL3 and the fourth electrode EL4 may be provided on the second horizontal extended portion HEP2, and the second read/write element RWE2 may be provided between the third and fourth electrodes EL3 and EL4. A fifth electrode EL5 and a sixth electrode EL6 may be provided on the second horizontal extended portion HEP2, and a third read/write element RWE3 may be provided between the fifth and sixth electrodes EL5 and EL6. A seventh electrode EL7 and an eighth electrode EL8 may be provided on the third horizontal extended portion HEP3, and a fourth read/write element RWE4 may be provided between the seventh and eighth electrodes EL7 and EL8.

In some embodiments, the magnetic domain MDO may be moved from the first end EN1 of the magnetic track MTR toward the second end EN2. The first read/write element RWE1 between the first and second electrodes EL1 and EL2 may execute a programming operation on the magnetic domain MDO such that the magnetic domain MDO has a specific magnetization direction.

The magnetic domain MDO may pass through the first curved portion CUP1, the first vertical extended portion VEP1, and the second curved portion CUP2. In particular, when the magnetic domain MDO passes through the first curved portion CUP1 and the second curved portion CUP2, a size of the magnetic domain MDO may be changed due to the curved structure of the magnetic track MTR.

Even when the size of the magnetic domain MDO is unintentionally changed, the size of the magnetic domain MDO may be adjusted to a desired size by the third and fourth electrodes EL3 and EL4. The second read/write element RWE2 may execute a reading operation on the magnetic domain MDO with the desired size to read out a data stored in the magnetic domain MDO.

Each of the third and fourth read/write elements RWE3 and RWE4 may execute the same operation as a corresponding one of the first and second read/write elements RWE1 and RWE2 described above.

In the magnetic memory device according to some embodiments of the inventive concepts, even when the size of the magnetic domain is unintentionally changed by a physical structure of the magnetic track MTR, by applying a bias through an electrode, it may be possible to actively correct the changed size of the magnetic domain. Accordingly, it may be possible to improve reliability in an operation of the magnetic memory device.

According to some embodiments of the inventive concepts, a velocity of a magnetic domain wall may be changed by applying a voltage to a magnetic track through an electrode. This may make it possible to actively control a size or bit size of the magnetic domain. That is, according to some embodiments of the inventive concepts, by adding a relatively simple element, such as the electrode, and applying a voltage to the element, it may be possible to actively control the size of the magnetic domain. Accordingly, it may be possible to realize more easily a magnetic memory device and to control the size of the magnetic domain in a relatively simple manner.

In the magnetic memory device according to some embodiments of the inventive concepts, the size of the magnetic domain may be temporarily increased to perform a read/write operation. Furthermore, in the magnetic memory device according to some embodiments of the inventive concepts, even when, due to a structure of the magnetic track, the size of the magnetic domain is changed in an undesirable manner, the size of the magnetic domain may be modified to a desired size. It may be possible to prevent erroneous operation of the device and to improve reliability in the read/write operation.

While some example embodiments of the inventive concepts have been particularly shown and described, it will be understood by one of ordinary skill in the art that variations in form and detail may be made therein without departing from the scope of the attached claims.

What is claimed is:

1. A magnetic memory device, comprising:
   a magnetic track extending in a first direction, the magnetic track having first and second ends; and
   a first electrode provided at a biasing point of the magnetic track between the first and second ends, the first electrode configured to apply a voltage to the magnetic track,
   wherein the magnetic track comprises a first region between the first end of the magnetic track and the biasing point and a second region between the biasing point and the second end of the magnetic track, and
   wherein the first electrode is configured to cause a difference between a first current density in the first region and a second current density in the second region.

2. The magnetic memory device of claim 1, wherein the magnetic memory device is configured such that a magnetic domain wall in the magnetic track moves in the first direction from the first end toward the second end,
   wherein movement of the magnetic domain wall in the first region is at a first velocity,
   wherein movement of the magnetic domain wall in the second region is at a second velocity, and
   wherein the first velocity is different from the second velocity.

3. The magnetic memory device of claim 2, wherein the first current density in the first region is greater than the second current density in the second region, and
   wherein the first velocity is greater than the second velocity.

4. The magnetic memory device of claim 2, wherein a magnetic domain in the first region has a first width in the first direction,
   wherein a magnetic domain in the second region has a second width in a second direction, and
   wherein the first width is different from the second width.

5. The magnetic memory device of claim 1, further comprising:
   a second electrode adjacent to the first electrode; and
   a read/write element provided on the magnetic track between the first electrode and the second electrode,
   wherein the read/write element comprises:
      a tunnel barrier pattern on the magnetic track;
      a magnetic pattern provided on the tunnel barrier pattern, the magnetic pattern having a fixed magnetization direction; and
      an electrode pattern on the magnetic pattern.

6. The magnetic memory device of claim 5, wherein the first electrode is configured to increase a size of a magnetic domain of the magnetic track that is moving in the first direction,
   wherein the read/write element is configured to execute a reading or writing operation on the magnetic domain with the increased size, and
   wherein the second electrode is configured to reduce the size of the magnetic domain.

7. The magnetic memory device of claim 1, wherein the magnetic track comprises:
   a conductive line including a heavy metal; and
   a magnetic line on the conductive line,
   wherein a magnetic domain wall in the magnetic line is configured to be moved in the first direction as a result of a current flowing through the conductive line,
   wherein the first electrode is configured to apply the voltage to the conductive line at the biasing point, and
   wherein a velocity of the magnetic domain wall is changed by the first electrode.

8. The magnetic memory device of claim 7, wherein the first electrode is provided on a bottom surface of the conductive line and in contact with the bottom surface.

9. The magnetic memory device of claim 1, wherein the magnetic track comprises a first portion, which is extended in the first direction in a line shape, and a second portion, which comprises a curved shape, and
   wherein the first electrode is provided near the second portion.

10. The magnetic memory device of claim 9, wherein a size of a magnetic domain, which is moved in the magnetic track, is changed by the second portion, and
    wherein the first electrode is configured to adjust the changed size of the magnetic domain to a selected size.

11. A magnetic memory device, comprising:
    a magnetic track including a conductive line including a heavy metal and a magnetic line on the conductive line;
    a first electrode and a second electrode provided on the magnetic track and adjacent to each other; and
    a read/write element provided on the magnetic line between the first and second electrodes,
    wherein the first electrode is configured to apply a first voltage to the conductive line, and
    wherein the second electrode is configured to apply a second voltage, which is different from the first voltage, to the conductive line.

12. The magnetic memory device of claim 11, wherein a first voltage source is configured to apply a third voltage to a first end of the conductive line,
    wherein a second voltage source is configured to apply a fourth voltage to a second end of the conductive line,
    wherein the magnetic track comprises a first region between the first end and the first electrode, a second region between the first electrode and the second electrode, and a third region between the second electrode and the second end, wherein a current density in the second region is greater than a current density in the first region, and wherein the current density in the second region is greater than a current density in the third region.

13. The magnetic memory device of claim 12, wherein a size of a magnetic domain in the second region is greater than a size of a magnetic domain in the first region, and wherein the size of the magnetic domain in the second region is greater than a size of a magnetic domain in the third region.

14. The magnetic memory device of claim 11, wherein the magnetic track comprises a vertical extended portion, a horizontal extended portion, and a curved portion between the vertical extended portion and the horizontal extended portion, and wherein the first and second electrodes are provided on the horizontal extended portion.

15. The magnetic memory device of claim 11, wherein the magnetic line is extended in a first direction, wherein the first electrode is configured to increase a size of a magnetic domain, which is moved in the magnetic line in the first direction, wherein the read/write element is configured to execute a reading or writing operation on the magnetic domain with the increased size, and wherein the second electrode is configured to decrease the size of the magnetic domain.

16. A method of controlling a domain size of a magnetic memory device, wherein the magnetic memory device comprises a magnetic track that extends in a first direction and a first electrode that is provided at a biasing point of the magnetic track, and wherein the magnetic track includes a first region between a first end of the magnetic track and the biasing point and a second region between the biasing point and a second end of the magnetic track, the method comprising:

applying first and second voltages to the first and second ends, respectively, to move a magnetic domain wall, which defines a magnetic domain, in the first direction; and applying a third voltage to the first electrode to move the magnetic domain wall in the first region with a first velocity and in the second region with a second velocity, the first velocity different from the second velocity.

17. The method of claim 16, wherein the applying of the third voltage to the first electrode results in a first current density in the first region that is different from a second current density in the second region.

18. The method of claim 17, wherein the first current density in the first region is greater than the second current density in the second region, wherein the first velocity is greater than the second velocity, and wherein a size of the magnetic domain in the first region is greater than a size of the magnetic domain in the second region.

19. The method of claim 17, wherein the first current density in the first region is less than the second current density in the second region, wherein the first velocity is less than the second velocity, and wherein a size of the magnetic domain in the first region is less than a size of the magnetic domain in the second region.

20. The method of claim 16, wherein a first difference between the first voltage and the third voltage is different from a second difference between the third voltage and the second voltage.

* * * * *